United States Patent
Josypenko

(10) Patent No.: US 9,257,736 B1
(45) Date of Patent: Feb. 9, 2016

(54) BROADBAND SPIRAL TRANSMISSION LINE POWER SPLITTER

(75) Inventor: Michael J. Josypenko, Norwich, CT (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 646 days.

(21) Appl. No.: 12/874,347

(22) Filed: Sep. 2, 2010

(51) Int. Cl.
*H01P 5/18* (2006.01)
*H01P 1/18* (2006.01)
*H01P 5/12* (2006.01)
*H01P 3/08* (2006.01)
*H03H 7/48* (2006.01)

(52) U.S. Cl.
CPC .............. *H01P 5/184* (2013.01); *H01P 1/184* (2013.01); *H01P 3/08* (2013.01); *H01P 5/12* (2013.01); *H03H 7/48* (2013.01)

(58) Field of Classification Search
CPC ............. H01P 3/08; H01P 1/184; H01P 5/12; H01P 5/184; H03H 7/48
USPC ......... 333/104, 109, 111, 116, 131, 136, 161, 333/185; 505/210, 700, 701, 866; 336/200
See application file for complete search history.

(56) References Cited

U.S. PATENT DOCUMENTS

| 4,800,345 | A | * | 1/1989 | Podell et al. ................... 333/111 |
| 6,130,652 | A | * | 10/2000 | Goetz et al. .................... 343/895 |
| 2007/0296519 | A1 | * | 12/2007 | Ezzeddine et al. ............ 333/131 |

* cited by examiner

*Primary Examiner* — Benny Lee
*Assistant Examiner* — Rakesh Patel
(74) *Attorney, Agent, or Firm* — James M. Kasischke; Jean-Paul A. Nasser; Michael P. Stanley

(57) ABSTRACT

The present invention features a broadband radio frequency (RF) device in the form of a power splitter. A broadband spiral transmission line power divider is used to divide power into two powers with a constant phase difference between the two divided powers. The power divider produces large bandwidths.

15 Claims, 8 Drawing Sheets

BROADBAND SPIRAL TRANSMISSION LINE POWER SPLITTER

STATEMENT OF GOVERNMENT INTEREST

The invention described herein may be manufactured and used by or for the Government of the United States of America for governmental purposes without the payment of any royalties thereon or therefore.

CROSS REFERENCE TO OTHER PATENT APPLICATIONS

None.

BACKGROUND OF INVENTION (1) Field of the Invention

The present invention relates generally to transmission lines and more particularly, to broadband spiral transmission line power splitters.

(2) Description of Prior Art

The use of ¼ wavelength 90 degree power splitters is well known in the prior art. For example, FIG. 1a and FIG. 1b show a prior art ¼ wavelength 90 degree power splitters comprising two "hot" lines $L_1$ and $L_2$ that are two unbalanced transmission lines running side-by-side for a ¼ wavelength distance on a dielectric surface sheet 108. The lines share a common ground plane and have a characteristic impedance, $Z_0$, to ground, which is usually 50 ohms. Also referring to FIG. 1c, the ground plane consists of a top metal ground plane gp1 and a bottom metal ground plane gp2. The two ground planes are held together by metal sides 110. If the power splitter is made symmetrical about a horizontal plane 2014 through the centers of the lines $L_1$ and $L_2$, so that the thickness 2001 of the space above the lines $L_1$ and $L_2$ equals the thickness 2002 of the space below the lines, and the unused space inside the cavity 2003 formed by the two ground planes gp1, gp2 and the two metal sides 110 is filled with the same dielectric material as dielectric 108, then the structure is strip line.

If as shown in FIG. 1b, thickness 2001 is appreciably larger than thickness 2002 and dielectric 108 only exists between the lines $L_1$ and $L_2$ and ground plane gp2, the structure is microstrip. In this case, there is little or no coupling between ground plane gp2 and lines $L_1$ and $L_2$, and thus ground plane gp2 serves more as a shield than a ground plane.

A first line $L_1$ has a first end 100 as an input (port relative to ground) and a second end 102 as an output (port relative to the ground). A second line $L_2$ has a first end 104 and is coupled to power of the first line $L_1$ wherein the amount of power coupled thereto increases as the coupling between the two lines increases and the separation between the two lines decreases. Even higher degrees of coupling occur if the lines $L_1$ and $L_2$ start to overlap each other without touching. The coupled output port relative to ground or first end 104 of the second line $L_2$ is on the same end as the input end 100 of the first line $L_1$. A second end 106 of the second line $L_2$ is an isolation or dump port relative to ground, and terminates to ground in $Z_0$. Ideally, when all of the ports are properly matched to $Z_0$, the resultant phase difference between the outputs of the first and second lines $L_1$ and $L_2$ is 90 degrees, and all of the input power is divided between the two output ports, with none of it going to the isolation port 106.

If the power splitter is made with microstrip, then access to the ports at the ends of the lines are made by placing connectors on the outside of the splitter located below the ends and below the ground plane gp2, such as for example at locations 2006 and 2007 for respective ports 104 and 106 for line L2. If the splitter is made with strip line, to maintain symmetry, the locations are moved up the sides 110 of the splitter to lie coincident with axis of the lines $L_1$ and $L_2$, such as for example locations 2008 and 2009 for respective ports 104 and 106 of lines L2. Since the two adjacent ends of the two lines $L_1$ and $L_2$ are usually very close to each other, the locations are spread out to allow two corresponding connectors to be placed adjacent to each other, and added lengths of transmission line are used to connect the connectors to the ends of the lines.

If the coupled power is less than one half the input power, the power splitter is also called a directional coupler, because the coupled power depends on the direction of the wave travelling along the line $L_1$. When power is applied to input port 100, it travels in a forward direction from the port to output port 102 and some of it is coupled to line $L_2$ at coupled port 104. No power is coupled to isolation port 106. If instead power were inserted at output port 102, it would flow backwards from the output port 102 to input port 100 and the roles of the coupled and isolation ports would become reversed. Power from the backward travelling wave would couple to port 106, which is now a coupled port, and none of the power would couple to port 104 which is now an isolation port. In general, if any given port of any first line serves as an input port, the opposite port of the first line will be an output port, the adjacent port on the second line will be a coupled port, and the opposite port of the adjacent port on the second line will be an isolation port.

Because the widths of lines $L_1$ and $L_2$ and their separation 2005 are much smaller than their $\lambda/4$ length, the size of the power splitter is primarily determined by the length of the lines $L_1$ and $L_2$. At lower frequencies this length can become excessive. One well known method to reduce the length of the lines is meandering. The lines $L_1$ and $L_2$ can be meandered about a center line between the two lines $L_1$ and $L_2$. FIG. 1d shows the prior art splitter as FIG. 1a where the lines $L_1$ and $L_2$ are separated less and are meandered. Reducing the line widths and their separation further would allow more meander cycles and a much smaller device. Care must be taken to avoid allowing adjacent section of a line, e.g. 1002 and 1003 from coming too close to each other. If the separation 1001 becomes too small, broadside coupling between the sections 1002 and 1003 occurs, and a second mechanism of power transfer between the line ends is introduced along the straight line direction 1004 between the line ends. Only the primary mechanism of power transfer along the transmission line paths of $L_1$ and $L_2$ should be allowed.

The coupling for the ¼ wavelength 90 degree splitter is frequency dependent wherein maximum coupling occurs every ½ wavelength starting at ¼ wavelength. Nulls in coupling occur every ½ wavelength starting at zero wavelengths between the maximum points. Normally the splitter is used at ¼ wavelength. Because the maximum at ¼ wavelength is between nulls at zero and ½ wavelengths, the ¼ wavelength 90 degree splitter is narrowband as far as constant coupling with frequency is concerned. To obtain broader bandwidth, additional ¼-wavelength sections of two coupled lines are added to the splitter, making it more complex.

A disadvantage of the ¼ wavelength 90-degree splitter of the prior art is that its length results in narrowband performance. In the alternative, a bifilar spiral appears lengthless in the radiation domain above a cut-in frequency. Different circumferential lengths radiate at different frequencies, so that radiation always occurs from a circumferential electrical length of one wavelength. When used as a transmission line, a length of a bifilar spiral is difficult to define. Starting at a center feed point of the bifilar spiral and moving outwardly in a circular direction the filar of the spiraled transmission line making up the bifilar spiral eventually couples broadside to itself (via the other filar) at the next turn and then at each succeeding turn with the circumferential length between each turn increasing. If the one-dimensional transmission line is of low $Z_0$ and highly coupled, the filar of the transmission line becomes highly coupled to itself, and the transmission line starts to appear to be a two-dimensional instead of a one-dimensional transmission line. Power is transferred in the circumferential direction via the two line transmission line and in the radial direction via broadside coupling. This differs from the $\lambda/4$ 90 degree splitter where power transfer is only via the two line transmission line. Thus the two-dimensional size and different circumferential lengths may allow broadband behavior.

U.S. Pat. No. 6,133,891, hereby incorporated by reference, describes spiral transmission lines. This patent describes two spirals that are crossed to form two crossed transmission lines comprising elements for feeding and matching a quadrifilar helix. The two transmission lines are approximately balanced and are of constant or smoothly changing $Z_0$ with length except for the last ½ of a turn of any given element on the outermost circumference. For a given transmission line length, the given filar has filars on both of its sides. However for the last ½ turn, the given filar has only one opposite filar, which is on the side closest the feed points (the central region) of the spiral. This increases the $Z_0$ of the transmission line along this ½ turn causing a mismatch.

The mismatch shows up as a small increased antenna mismatch when the transmission line is used to feed and match the antenna. If the width of the filar is increased in the area of the ½ turn to increase capacitance to the opposite filar, the $Z_0$ between the ½ turn of filar and its opposite transmission line filar decreases back to normal. But now the capacitance between the opposite filar and its two surrounding opposite filars, which includes the widened ½ turn of filar, becomes larger than normal resulting in its $Z_0$ becoming lower than normal. Thus, this attempt at fixing the first mismatch of the ½ turns of filar creates a second mismatch.

SUMMARY OF THE INVENTION

The present invention features a broadband radio frequency (RF) device in the form of a power splitter. A broadband spiral transmission line power splitter is used to divide power into two powers with a constant phase difference between the two divided powers. The power splitter produces large bandwidths.

BRIEF DESCRIPTION OF THE DRAWINGS

These and other features and advantages of the present invention will be better understood in view of the following description of the invention taken together with the drawings wherein.

DETAILED DESCRIPTION OF THE INVENTION

Figure 1A:
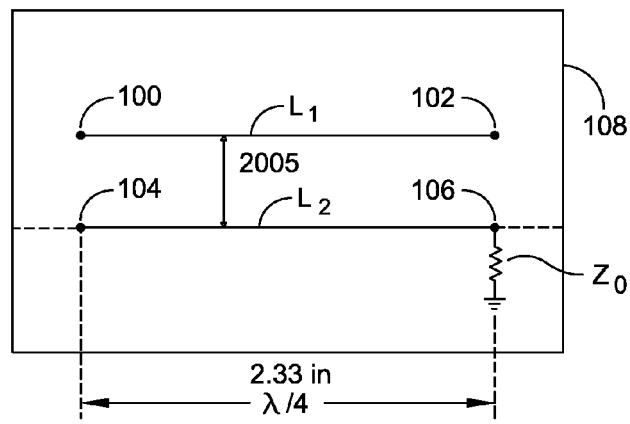
FIG. 1a is a top view schematic of a 90-degree power splitter known in the prior art.
Figure 1B:
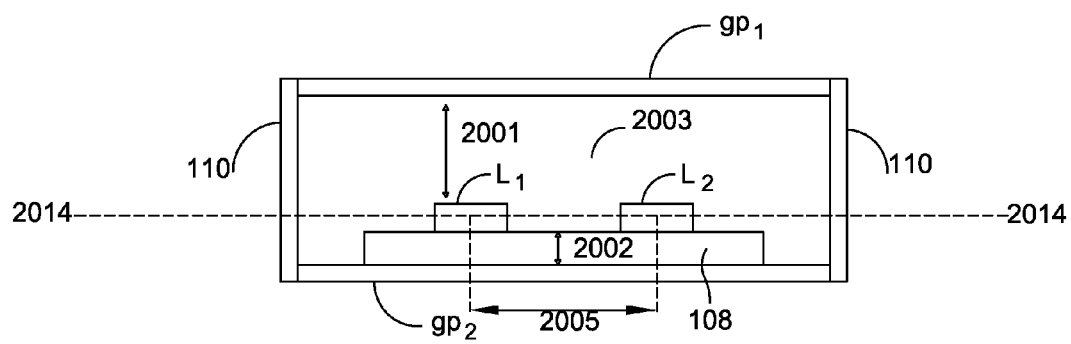
FIG. 1b is a width side cross sectional view schematic of a 90 degree power splitter known in the prior art.
Figure 1C:
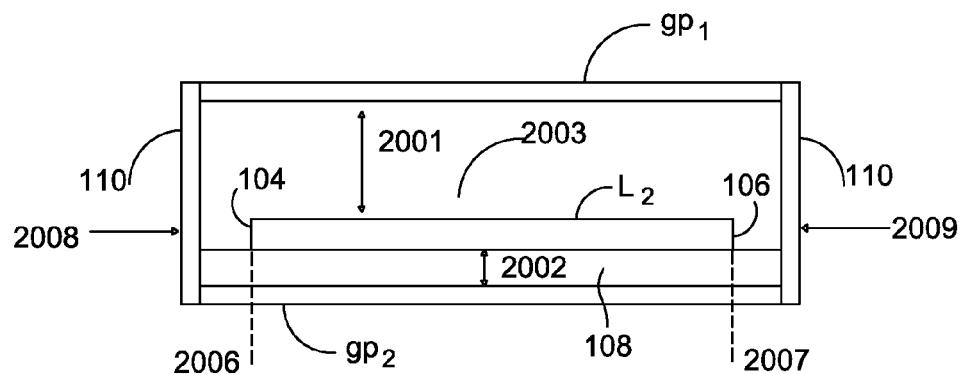
FIG. 1c is a schematic of a length side cross sectional view through the center of one of the filars of a 90 degree power splitter known in the prior art.
Figure 1D:
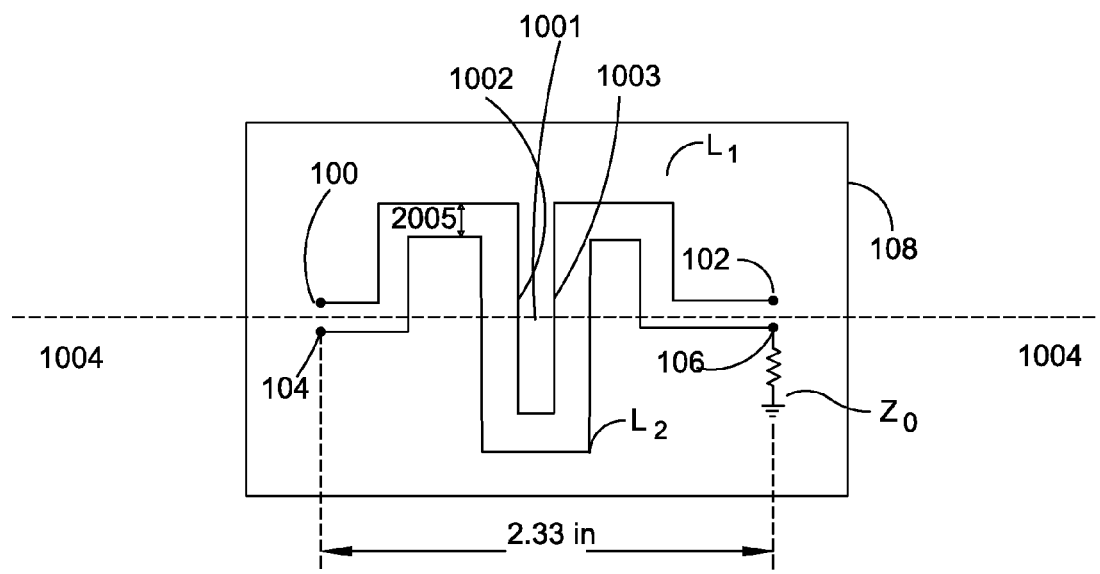
FIG. 1d is a side cross sectional view schematic of a 90 degree power splitter known in the prior art after it has undergone meandering.
Figure 2A:
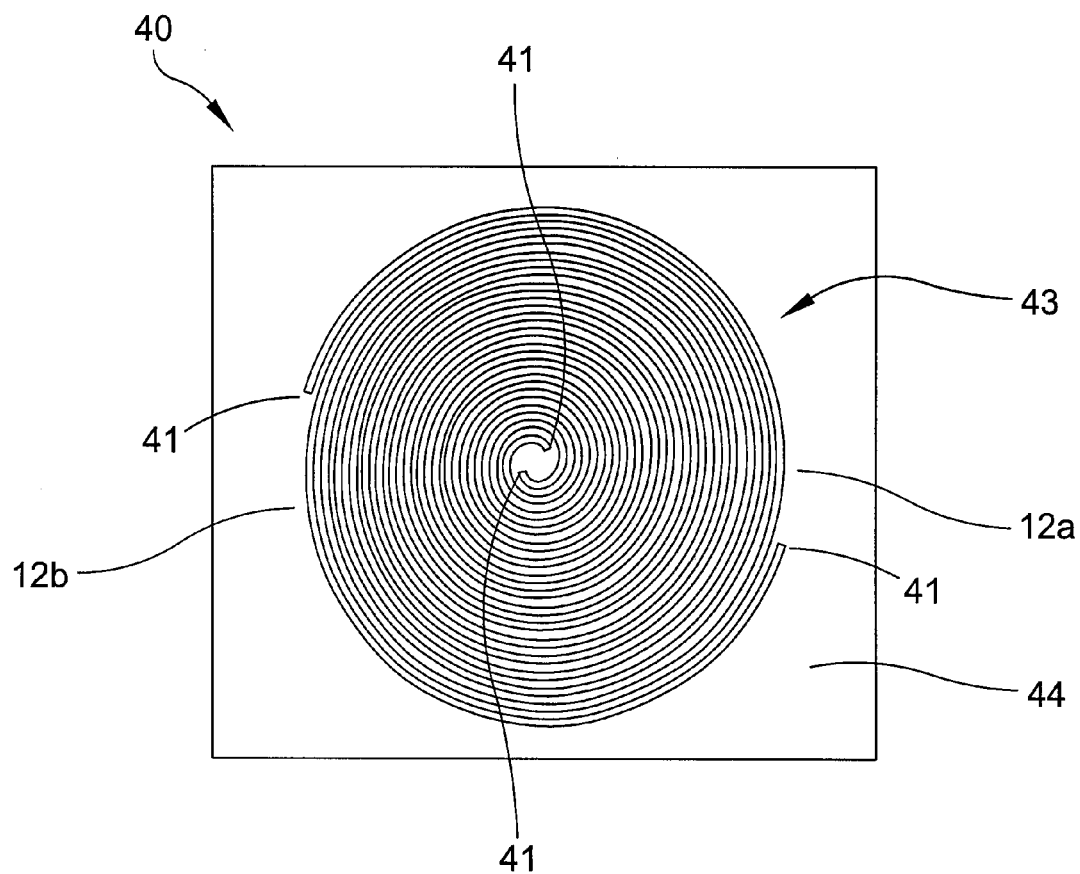
FIG. 2a is a top view of a bifilar spiral mounted above a ground plane according to one embodiment of the present invention.
Figure 2B:
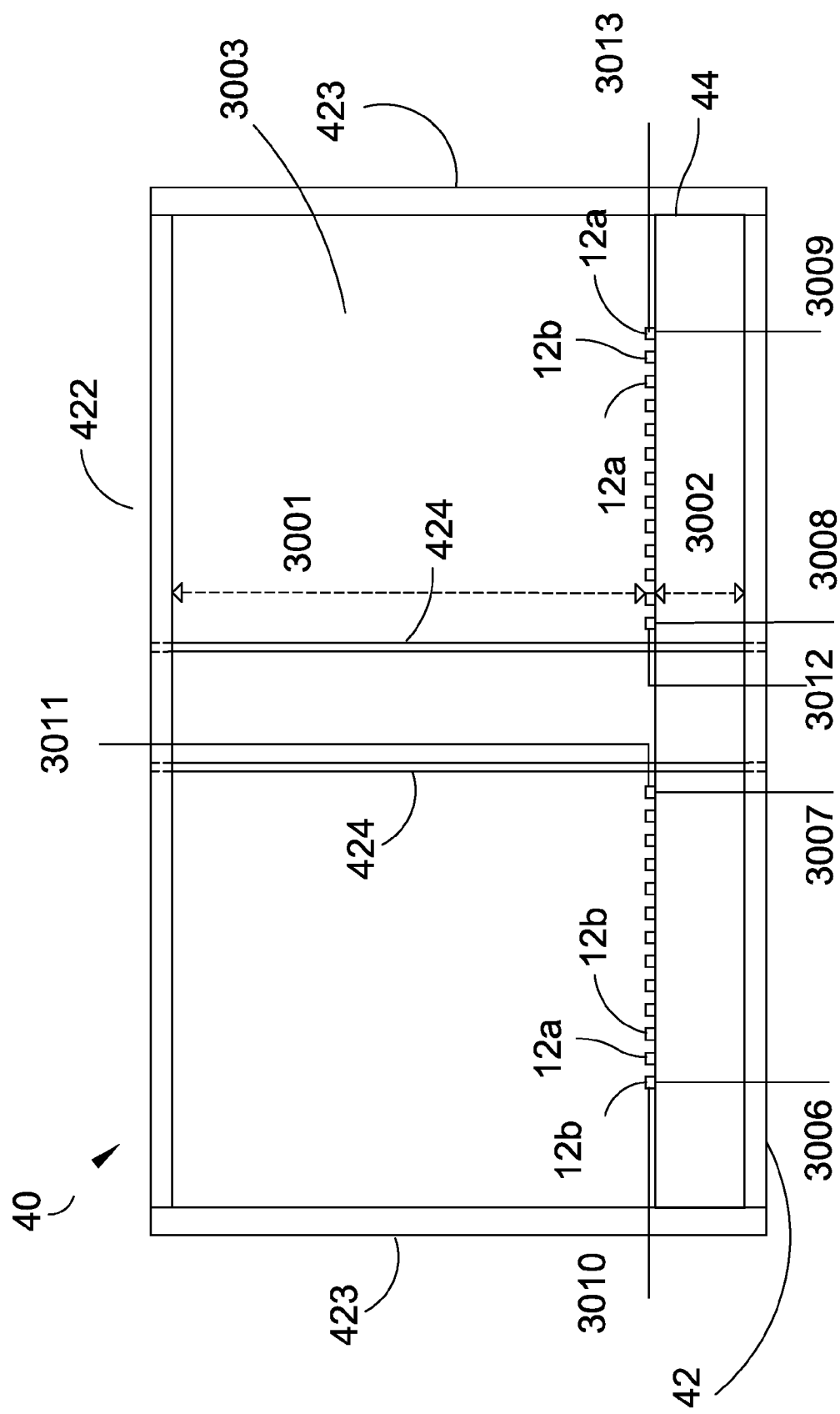
FIG. 2b is a side cross sectional view of a bifilar spiral mounted above a ground plane according to one embodiment of the present invention.

A bifilar spiral power splitter 40, as illustrated in FIG. 2a and FIG. 2b, is made by modifying the traditional ¼ wavelength 90 degree power splitter shown in FIG. 1a. A bifilar spiral 43 composed of interleaved filars 12a and 12b, is placed between a common ground plane formed by a top ground plane 422 and a bottom ground plane 42 both of which are supported by metal sides 423. Ends 41 of the filars 12a and 12b are fed or feed against the common ground in a 50 ohm system, as opposed to the filars 12a and 12b being fed against each other at the center of the spiral 43.

If the bifilar spiral power splitter 40 is made of microstrip, the distance 3001 between the top ground plane 422 and the filars 12a and 12b is significantly larger than the distance 3002 between the filars 12a and 12b and the bottom ground plane 42, and the space 3003 above the spiral 43 is air. This causes little coupling between spiral 42 and top ground plane 422 and thus the top ground plane 422 is only a shield. Between the spiral 43 and bottom ground plane 42 is an insulating dielectric substrate 44 through which the spiral 43 mostly couples to the bottom ground plane 42. Connectors are placed on the outside bottom of the bottom ground 42 to connect to the filar ends 41 and port locations at locations 3006, 3007, 3008 and 3009.

If the bifilar spiral power splitter 40 is made of stripline, the top and bottom separations 3001 and 3002 are equal, and insulating dielectric substrate 44 is on both sides of the spiral 43 and the adjacent ground planes 42 and 422. Coupling to both ground planes 42 and 422 is equal. The connectors are moved to be in line with the spiral plane. The two connectors on the outer edges of the spiral 43 are moved up the metal sides 423 to connect to the outer spiral ends at locations 3010 and 3013. For the inner ends of the spiral 43, a metal cylinder 424 of radius less than the radius of an inner end of a filar 12a or 12b is centered on the vertical axis of the spiral 43 to connect to the top and bottom ground planes 42 and 422. Material from the two ground planes 42 and 422 and part of the insulating dielectric substrate 44 are removed to allow for the presence of the metal cylinder 424. The two connectors on the inner edges of the spiral 43 are moved up the sides of the metal cylinder 424 to connect to the inner spiral ends at locations 3011 and 3012. To allow for the size of the connectors, the inner radius of the spiral 43 is increased. As an alternative, an added length of coaxial cable can be used to extend the connection point to the bottom of the bottom ground plane 42, where connectors would be added.

The bifilar spiral power splitter 40 may have broadband properties, since a first filar 12b is coupled on both sides by a second filar 12a, and the transmission lines composed of coupled filars 12*a* and 12*b* relative to ground take on a two-dimensional form, where a radial cross-section crosses continuously alternating sections between the first filar 12*b* and the second filar 12*a*. As the spiral radius increases, the bifilar spiral 43 has circumferences of transmission line that increase in length. The broadside coupling between the varying circumferential lengths of transmission line may allow broad banding or large bandwidths (e.g., 2:1).

Referring now to FIGS. 3-5*a* there is illustrated a slightly modified and detailed embodiment of the present invention wherein one of the bifilar spirals of the previous described two open crossed bifilar spirals of U.S. Pat. No. 6,133,891 is modified by placing it above ground plane 57 to form bifilar spiral power splitter 51 having broadband properties, as described in the previous paragraph.

Figure 3:
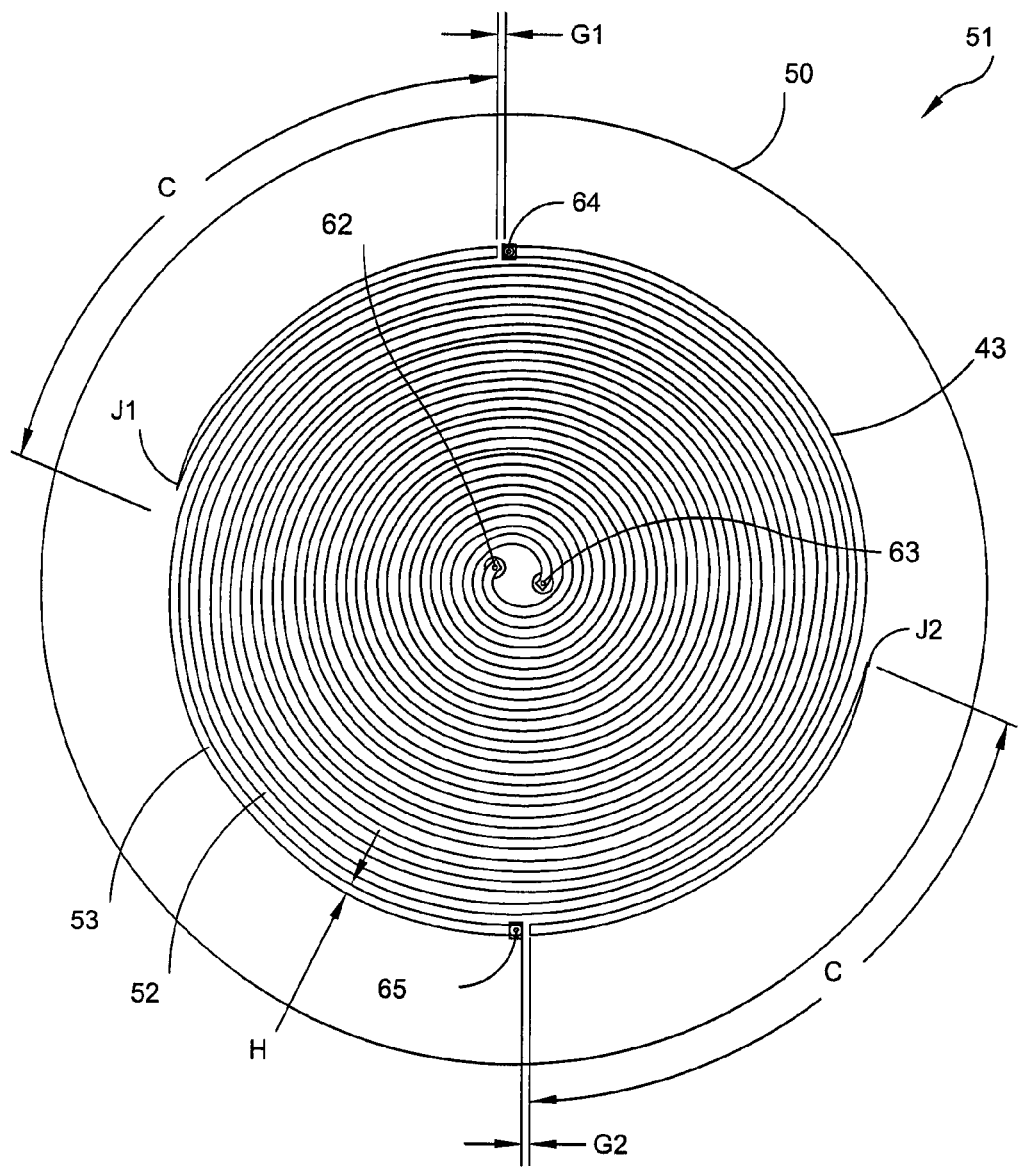
FIG. 3 is the bifilar spiral power splitter of FIG. 2a composed of a bifilar spiral mounted above a ground plane slightly modified and in more detail.
Figure 4:
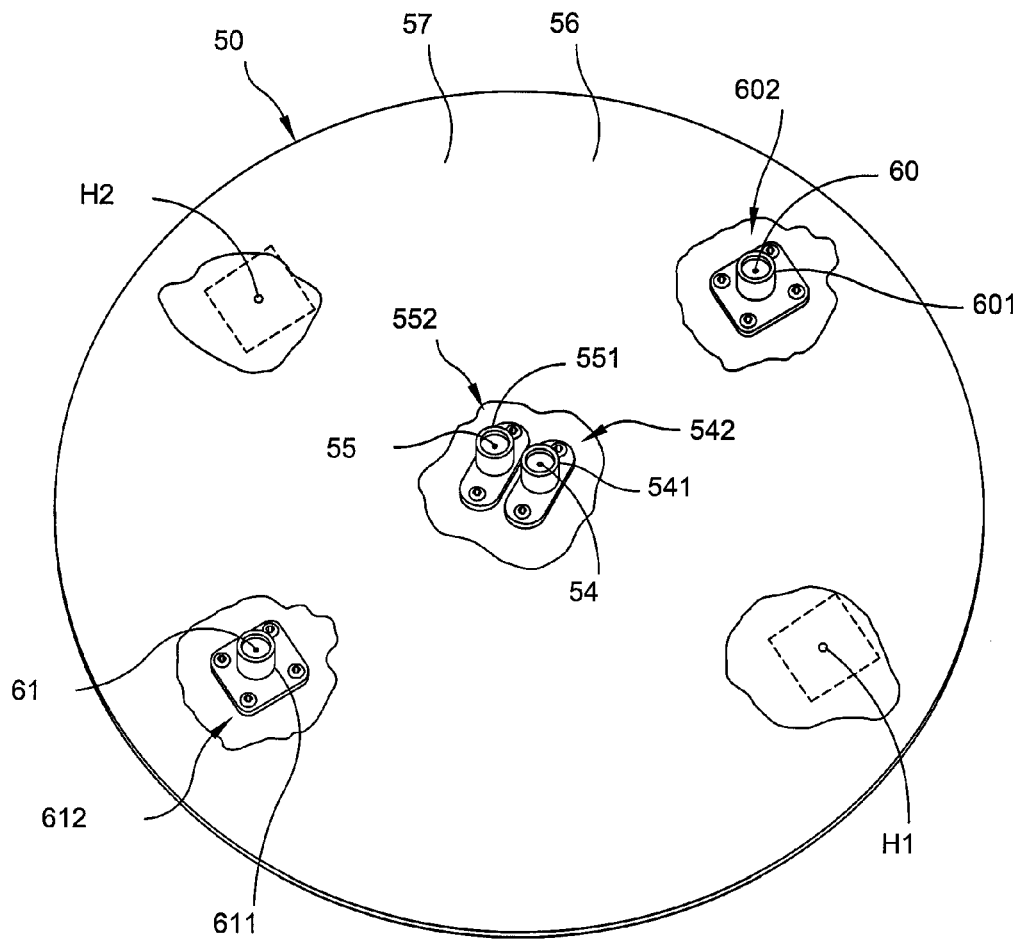
FIG. 4 is the backside of the ground plane of the bifilar spiral power splitter shown in FIG. 3.
Figure 5A:
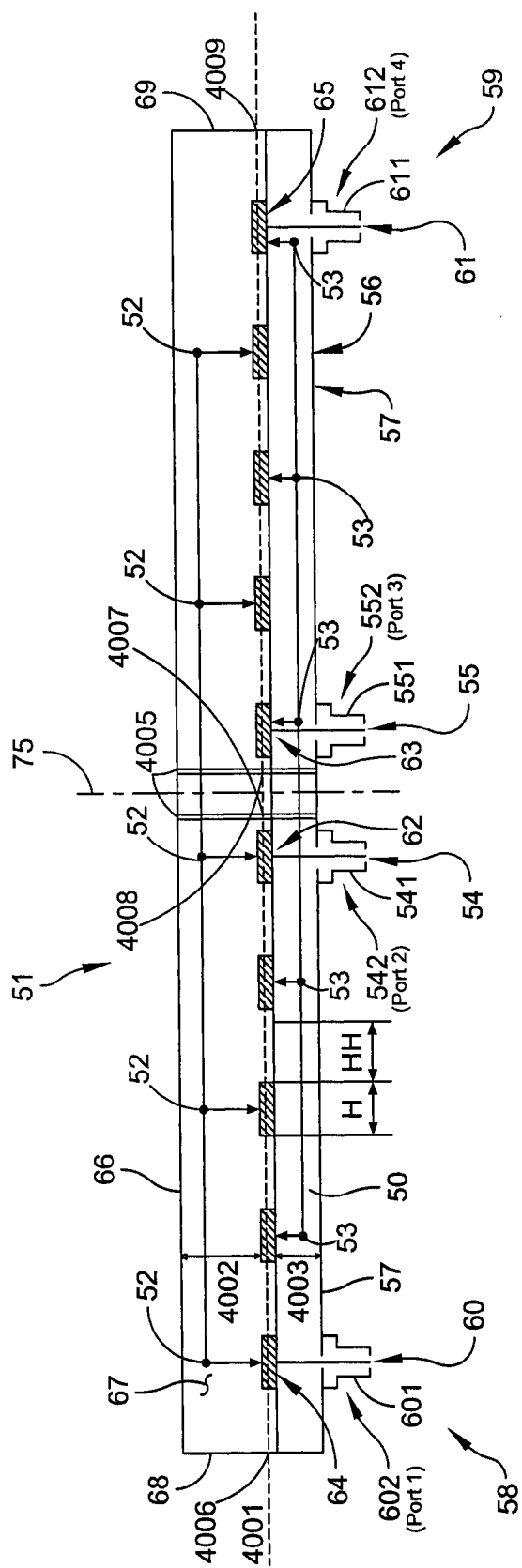
FIG. 5a is a cross-sectional view of the bifilar spiral power splitter shown in FIGS. 3 and 4.

The power splitter 51 illustrated in FIGS. 3, 4, and 5*a* comprises a fiberglass board 50 having a thickness of 1/16 of an inch. The bifilar spiral 43 has two filars 52, 53 shaped as an Archimedean spiral. The filars 52, 53 are copper plated and attached to a surface of the fiberglass board 50. The bifilar spiral 43 has a width of 4.3 inches. The filars 52, 53 have a width "H" of 3/32 of an inch, and the separation between the filars 52, 53 is approximately 3/32 of an inch except for the last 1/8 of a turn, designated as "C". This is so because the widths of the filars 52, 53 taper down to a fine strip at their ends most distant from a center axis 75 of the bifilar spiral 43. The filars 52, 53 have beginning points 62, 63, near the center of the spiral, commonly used as the feed points for a normal bifilar spiral by itself. The beginning points 62, 63 are operatively connected to extended center conductors 54, 55 of coaxial connectors 542, 552. The coaxial connectors 542, 552 are preferably SMA coaxial connectors. The center conductors 54, 55 protrude through a backside 56 of the fiberglass board 50 to the filar ends. The outer conductors 541, 551 of coaxial connectors 542, 552 are soldered to a copper tape or copper plated ground plane 57, which covers the entire backside 56 of the fiberglass board 50.

The ends of the filars 52, 53 that are furthest from the beginning points 62, 63 at the outermost circumference of the bifilar spiral 43 are operatively connected to center conductors 60, 61, respectively of 2 coaxial connectors 602 and 612. The coaxial connectors are preferably SMA connectors. The center conductors 60, 61 protrude through the backside 56 of the fiberglass board 50 to the filar ends. The outer conductors 601, 611 are soldered to the ground plane 57, which covers the backside 56 of the fiberglass board 50. However, the end lengths of the filars 52, 53 starting at points 64, 65 are tapered at the last 1/8 of the turn and add excessive inductance to the impedance of the filars 52, 53 when the power splitter 51 is matched to 50 ohms with the center conductors 60, 61 of connectors 602 and 612 connected to filar ends J1 and J2 located at H1 and H2. Thus, to correct this, the filars 52, 53 are terminated before the taper starting at 64, 65 by adding gaps G1, G2 in the filars 52, 53, and connectors 602 and 612 are moved before the gaps where their center conductors 60 and 61 are connected to filars 52 and 53. The gaps G1, G2 are made across the filars 52, 53. The gaps G1, G2 disconnect the last 1/8 turn of the filars 52, 53. Disconnecting the filars 52, 53 before the taper ensure that the filars 52, 53 have a constant width. The tapers starting at points 64, 65 of the filars 52, 53 are not removed to maintain a gradual transition from conductor to nonconductor along the circumferential and radial directions.

A second ground plane 66 is placed over and insulated with a dielectric layer 67 from the bifilar spiral 43, thereby placing the filars 52, 53 between two ground planes 57, 66 similar to a stripline configuration. If dielectric layer 67 is removed and ground plane 66 is placed high enough above the spiral 43 to prevent coupling to the spiral 43, then the configuration is microstrip. By placing the filars 52, 53 between the ground planes 57, 66, the bifilar spiral 43 is precluded from radiating. However, the impedance of either of the filars 52 or 53 with respect to the first ground plan 57 is greater than 50 ohms because of the smaller than required width of the filars 52 and 53. To lower the impedance to 50 ohms, the distance of the second ground plane 66 from the bifilar spiral 43 is adjusted until a low VSWR is realized at any of the inputs of any connectors attached to the bifilar spiral power splitter 51 (any given port) with all other connectors (ports) terminating in 50 ohms.

The ground planes 57 and 66 are normally operatively connected together by placing metal sides 68, 69 around the entire perimeter of the fiberglass board 50. The combination of the ground planes 57, 66 and the metal sides 68, 69 encloses and shields the power splitter 51.

For the configuration of power splitter 51 to be made truly stripline, then it is made symmetrical about horizontal plane 4001 that passes through the plane of the spiral 43. The distance 4002 between the spiral 43 and top ground plane 66 is made the same as the distance 4003 between the spiral 43 and bottom ground plane 57. The connectors are moved up and rotated so that their center conductors lie horizontally in plane 4001. Connector 602 is moved up to location 4006 and its outer conductor 601 is instead soldered to metal side 68. Connector 61 is moved up to location 4009 and its outer conductor 611 is instead soldered to metal side 69. For the inner connectors, a vertical metal surface is provided by drilling a hole about the vertical axis 75 in the structure to allow insertion of a metal cylinder 4005. The top of cylinder 4005 is soldered to the edge of the resultant hole in ground plane 66. The bottom of cylinder 4005 is soldered to the edge of the resultant hole in ground plane 57. Connector 54 is moved up to location 4007 in the metal cylinder 4005 and its outer conductor 541 is instead soldered to the inside surface of metal cylinder 4005. In the same fashion connector 55 is placed at location 4008. If there is no room inside the cylinder 4005 for connectors 54 and 55, then they are placed outside of the splitter 51 and short lengths of coaxial cable are used to connect them to their respective locations 4007 and 4008.

Figure 5B:
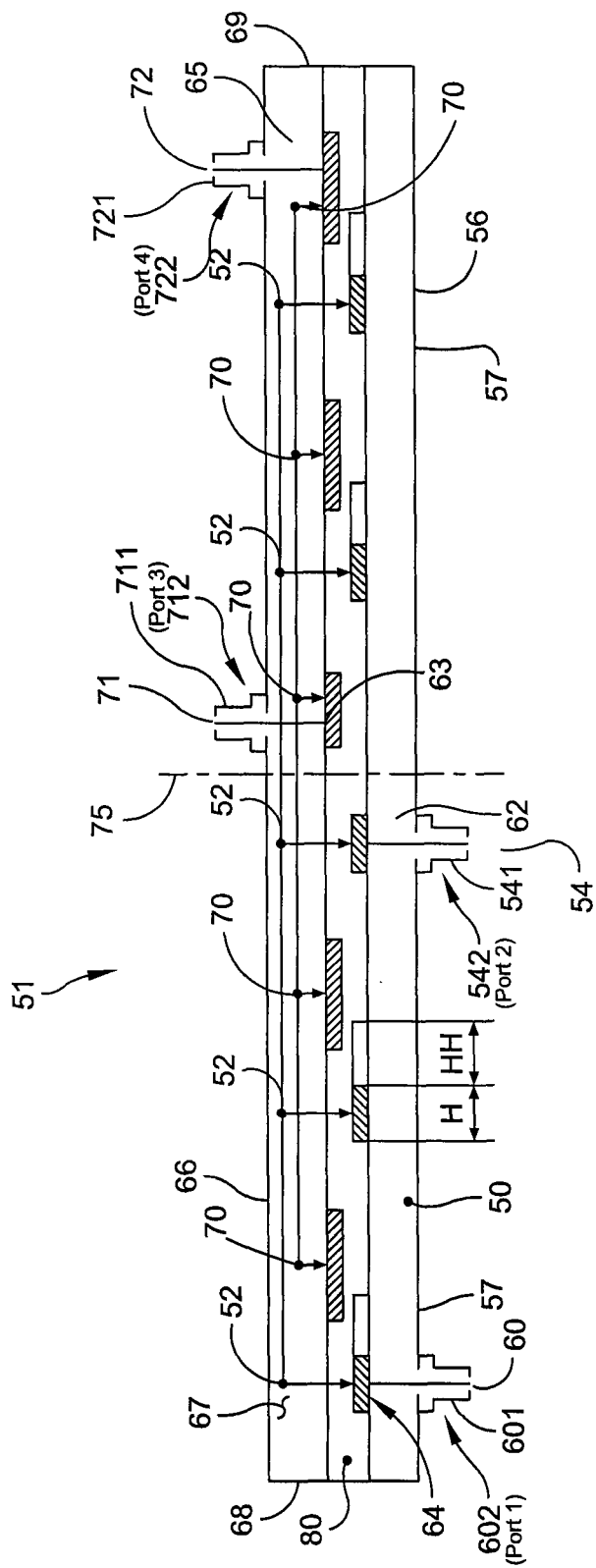
FIG. 5b is an alternative embodiment of the bifilar spiral power splitter shown in FIGS. 3 and 4 with some of the connectors flipped.

In an alternative embodiment, shown in FIG. 5*b*, the filars 52, 53 are required to be overlapped because of higher desired coupling between the filars 52, 53. Overlapping is done by flipping over one of the filars 53 to lie on the dielectric layer 67 which lies on the second ground 66. Optionally the inner center conductor 55 and outer connector 551 of connector 552, and the outer center conductor 61 and outer conductor 611 of connector 612 are flipped over so that the outer conductors of the connectors lie on and connect to the second ground 66. The locations of the optionally flipped over connectors is shown in FIG. 5*b*; the locations of the not flipped over connectors is shown in FIG. 5*a*. The filar 53 becomes filar 70, and optionally center conductors 55 and outer conductor 551 of connector 552 becomes alternate center conductor 71 and outer conductor 711 of connector 712, and center conductor 61 and outer conductor 611 of connector 612 becomes alternate center conductor 72 and outer conductor 721 of connector 722. In essence, the filars 53, and optionally center conductor 55 and outer conductor 551 of connector 552, and center conductor 61 and outer conductor 611 of connector 612 are replaced by filar 70, and optionally the alternate center conductor 71 and outer conductor 711 of connector 712, and the alternate center conductor 72 and outer conductor 721 of connector 722. Further, the filars 52, 70 are widened by width "HH". The dielectric layer 80 is inserted between the filars 52 and 70 to keep them from touching each other.

With four connectors placed on the bifilar spiral power splitter 51 and the structure adjusted for a 50 ohm system, S parameters were measured between all ports that are not symmetrical, between 0 and 400 MHz, for the power splitter shown in FIG. 5a, without dielectric 67 and sides 68 and 69.

The power splitter 51 has ports 1 (64) and 4 (65) located near outside ends of the bifilar spiral 43 at the truncated end of the filars before the gaps and are shown further apart than ports 2 (62) and 3 (63), which are the beginning points 62, 63 of the bifilar spiral 43. Since the ports must physically connect to the outside world, the coaxial connectors connected to these port points are more appropriately called the ports. Thus, e.g., connector 602 can be considered the port at 64 instead of 64.

Measurements are described in the table below. Unused ports for a particular measurement are shown terminated to ground. The port order for the "S" parameters is reversed and not in the normal convention (e.g., $S_{21}$ is written as $S_{12}$). This is to emphasize the physical paths from one port to another, whereas normal convention emphasizes power at an output port relative to power at an input port. A measurement is taken with one ground (57) and then a measurement is taken with two grounds (57 and 66). For lower frequencies, radiation from the one ground measurement is insignificant. However, at higher frequencies, radiation is significant and the presence of the second ground is needed to prevent unwanted radiation.

The removal of the metal sides also allowed some adjusting of coupling between filars by adjusting the height of the top ground planes 66 relative to the spiral 43. The more a filar is surrounded by ground, the less it couples to adjacent filars. The top ground plane 66 is more of a floating ground than a true ground, because with the sides missing it is not connected to the bottom ground plane 57 and the cables' outer conductors. However, the filars 52 and 53 can still couple to ground via coupling to the top ground plane 66 since the top ground plane 66 itself is highly coupled to the bottom ground plane 57 when it is close to it. When the top ground plane 66 is far enough from the spiral 43 or missing, the structure is microstrip. When it is close enough so the spiral 43 can couple to it, the structure is a modified form of strip line. Physically, the second ground 66 was implemented by holding a metal plate at a short distance above the bifilar spiral 43; or by inserting a thin layer of foam plastic between the spiral and the metal plate. The following measurements were taken:

| MEASURE-MENTS | PORTS | $2^{ND}$ GROUND | MEASUREMENT (all unused ports are terminated in 50 ohms) |
|---|---|---|---|
| 1 | 1 | no | $S_{11}$, outer port |
| 2 | 1 | yes | $S_{11}$, outer port |
| 3 | 2 | no | $S_{22}$, inner port |
| 4 | 2 | yes | $S_{22}$, inner port |
| 5 | 1 2 | yes | $S_{12}$ magnitude, $S_{12}$ phase set to 0° |
| 6 | 1 3 | yes | $S_{13}$ magnitude, $S_{13}/S_{12}$ phase |
| 7 | 1 4 | yes | $S_{14}$ magnitude, $S_{14}/S_{12}$ phase |
| 8 | 1 2 | no | $S_{12}$ magnitude, $S_{12}$ phase set to 0° |
| 9 | 1 3 | no | $S_{13}$ magnitude, $S_{13}/S_{12}$ phase |
| 10 | 1 4 | no | $S_{14}$ magnitude, $S_{14}/S_{12}$ phase |
| 11 | 2 1 | yes | $S_{21}$ magnitude, $S_{21}$ phase set to 0° |
| 12 | 2 4 | yes | $S_{24}$ magnitude, $S_{24}/S_{21}$ phase |
| 13 | 2 4 | yes | $S_{24}$ magnitude, $S_{24}/S_{12}$ phase measured with second ground tighter to spiral, about 1/64" |
| 14 | 2 3 | yes | $S_{23}$ magnitude, $S_{23}/S_{12}$ phase |
| 15 | 2 1 | no | $S_{21}$ magnitude, $S_{21}$ phase set to 0° |
| 16 | 2 4 | no | $S_{24}$ magnitude $S_{24}/S_{21}$ phase |
| 17 | 2 3 | no | $S_{23}$ magnitude, $S_{23}/S_{21}$ phase |

| PORT NUMBER | PART NUMBER | MEASUREMENT 1-4, PORT TYPE | MEASUREMENT 5-10, PORT TYPE | MEASUREMENT 11-17, PORT TYPE |
|---|---|---|---|---|
| 1 | 602 | input | input | output |
| 2 | 542 | input | output | input |
| 3 | 552 | | isolation | coupled |
| 4 | 612 | | coupled | isolation |

The first four sets of measurements were performed to ascertain how well the power splitter 51 was matched. The tapered outer ends of the filars 52 and 53 added excessive inductance. Thus, the ends of the filars 52 and 53 were terminated prior to the taper starting at 64, 65. With only the first ground plane 57 on the power divider 51, the impedance on a Smith Chart was found to be centered at approximately 65 ohms. Adding the second ground increased shunting between the filars 52, 53, and ground plane 57 lowering the impedance to the desired 50 ohms, although the impedance locus was not as tight as for the case of 65 ohms. VSWR measurements indicated that the low frequency area of 0 to 500 MHz was reasonably matched. It is desirable to have the power splitter 51 operating in a well-matched area where it does not radiate. For a general idea of where the spiral 43 can be expected to radiate, for the bifilar fed by itself in free space, with a diameter of 4.3 inches, radiation starts at 874 MHz. This is defined as a radiation cut-in frequency. The addition of one ground plane to the bifilar spiral 43 raises cut-in a large amount. The addition of two grounds will ensure almost no radiation, making an even higher cut-in. A higher radiation cut-in allows raising the power divider's operational frequency. Thus with radiation starting well above 500 MHz, it is desirable to improve the match beyond 500 MHz if possible, if operation at higher frequencies is desired.

Measurements 5-7, referenced in the table of 17 measurements above, were taken when an outer (radius) port 1 (connector 602) is an input port feeding through to an inner radius port 2 as an output port or 3 as an isolation port (connector 542 or 552) or to the other outer port 4 as a coupled port (connector 612). Measurement 5 is of $S_{12}$ with a reference phase being set at 0-degrees between port 1 and port 2, and indicates the loss through a filar path. The loss at 0 Hz is 0 db, but it increases to 2 db at 400 MHz. Measurement 6 is the difference when the output is switched to the isolation port 3. From about 40 to 400 MHz, there was seen an approximately flat response. The phase of $S_{13}$ relative to $S_{12}$ is 110 degrees, and the $S_{13}$ power transfer is −28 db+/−2 db. This is a broadband power divider because 400 MHz/40 MHz is a 10:1 bandwidth. However, its power level is significantly lower than the −19 db of the couple port discussed below. Further measurements found that small adjustments of the distance between the second ground plane and the spiral could bring the phase difference to 90 degrees.

A cut-in frequency was seen in $S_{13}$ at 40 MHz. (The cut-in frequency is defined as the frequency below which the amplitude response drops significantly with decreasing frequency.) This is due to the fact that at 0 Hz, the response is being measured across two lines that are simply a capacitor. Above 400 MHz the flat response was lost. This may be due to the size of the bifilar spiral 43.

$S_{14}$ measurement 7 of the coupled port showed a ½ wavelength cyclic amplitude response of about −19 db starting at a filar ¼ wavelength length at 35 MHz. The filars 52, 53 are approximately 57.6 inches in length, which is ¼ wavelength at 51.3 MHz. Dielectric loading due to the fiberglass brought this frequency down to 35 MHz. Nulls occur every ½ wavelength of filar length. The phase response was not the constant phase seen in a prior art 90 degree splitter. From 0 to 400 MHz, phase cycled every ½ wavelength about 145 degrees, with overall phase decreasing with each cycle.

Overall when comparing the spiral splitter 51 with the prior art 90 degree splitter, there are similarities and differences. Isolation power is low but its phase is constant which allows it to be used as an inefficient broadband power splitter. The prior art splitter isolation phase is not constant. Coupled power is significantly higher and cycles every ½ wavelength, but its phase is not the constant 90 degrees of the prior art splitter, which allows the coupled port of the prior art splitter to be used as a narrow band power splitter. This disallows the coupled port from being used for power splitting. Thus the spiral splitter 51 has a better constant phase and amplitude response on what would be the isolation port on a normal prior art 90 degree splitter.

The second ground plane was removed to see the effects of increased broadside coupling. Thus measurements 8-10 repeat measurements 5-7 but without the second ground plane. Differences are: isolation response $S_{13}$ had a flatter broadband phase response and it swapped to negative at −90+/−10 degrees. $S_{13}$ amplitude increased significantly from −28 db (+/−2 db) to −12 db (+/−2 db) from 50 to 290 MHz with a null at 370 MHz. Flatness bandwidth decreased. The null and reduced flatness may be due to some radiation at higher frequencies. $S_{13}$ had a much lower cut-in frequency. Coupling port S14 amplitude changed from −19 db to −125 db. The significant increase in $S_{13}$ and $S_{14}$ shows removal of the second ground allows significant increase in broadside coupling. More importantly, the power level of the broadband isolation port is slightly more than the power of the unusable coupled port, making the splitter more usable.

Because unlike the normal 90 degree splitter, the ports on both ends of the filars of the spiral splitter 51 are not symmetrical, measurements 5-10 were repeated with the change of the bifilar spiral 43 being fed from an inner port instead of an outer port. This can be looked upon as corresponding to measuring the S parameters of a 90 degree power splitter in the reverse direction. Measurements 11-17 are the measurements when the bifilar spiral 43 was fed from an inner port to the outer ports or to the other inner port. Thus, the $S_{21}$ and $S_{12}$ (output ports) measurements correspond, the $S_{24}$ and $S_{13}$ (isolation ports) measurements correspond, and the $S_{23}$ and $S_{14}$ (coupled ports) measurements correspond. Measurements of the corresponding responses between inner fed and outer fed cases yield the following results. For the case with the second plane removed, measurements 15 to 17, and 8 to 10, coupled and isolation responses were similar except the coupled phase of $S_{23}$ started to cycle every half wavelength about zero degrees. For the case of the presence of the second ground plane, measurements 11 to 14 and 5 to 7, coupled and isolation responses were similar except for the inner fed case of isolation $S_{24}$, $S_{24}$ had a wider bandwidth than the outer fed case of $S_{13}$. The bandwidth was from 40 to 500 MHz, at 12.5:1. A change in performance was found for $S_{24}$ when the second ground was placed tighter on the bifilar spiral 43. The cut-in frequency was reduced in half, and the phase response went from approximately 100 degrees to a flatter 90 degree response. The prior flat response, of −27 db (+/−2 db) was found to become −20 db (+/−2 db) for a bandwidth from 20 to 400 MHz, or a 20:1 bandwidth. For the inner fed case of coupled power $S_{14}$ the magnitude decreased to about −27 db. Some of the ½ wavelength magnitude nulls were partially filled in and the phase mainly cycled every 4 wave length about zero degrees, and for some part of the zero to 400 MHz band was reasonably flat.

Overall, the case that is most usable for a power splitter occurs at the second port where the power to be divided has broadband constant magnitude and phase response and has more power than the other unused port. For the spiral power splitter 51, the used broadband port is the isolation port, and the unused port becomes the coupled port. The following table determines the case where the used port has the most relative power:

| MEASUREMENTS | INPUT PORT LOCATION | $2^{ND}$ GROUND | ISOLATION PORT POWER (+/−2 db) | COUPLED PORT POWER (+/−2 db) | USED/ UNUSED POWER |
|---|---|---|---|---|---|
| 5 to 7 | outer | yes | $S_{13} = -28$ db | $S_{14} = -19$ db | −9 db |
| 8 to 10 | outer | no | $S_{13} = -12$ db | $S_{14} = -12$ db | 0 db |
| 11, 12, 14 | inner | yes | $S_{24} = -27$ db | $S_{23} = -27$ db | 0 db |
| 13 | inner | yes, tighter | $S_{24} = -20$ db | $S_{23} = -27$ db | 7 db |
| 15 to 17 | inner | no | $S_{24} = -11$ db | $S_{23} = -15$ db | 4 db |

It is apparent that feeding the splitter 51 from the inner port gives more power to the used versus unused ports. Measurement 13, where inter-filar coupling is tighter from the tighter second ground plane, is the best case where this ratio is 7 db. Thus the best case of the general configuration investigated has a splitter fed on an inner port with the second floating ground plane highly coupled to the filars. Input port power is divided between the output port and the isolation port, while the coupled port is unused and terminated with 50 ohms In conclusion, the power splitter 51 provides a design producing approximately flat broadband responses and large bandwidths. The power splitter 51 appears to have little directivity when compared to known 90 degree splitters. In fact, when compared to a known 90 degree power splitter, what would be considered the isolated port performs better at coupling a flat magnitude and phase response than what would be considered the coupled port. Additionally in conclusion, the presence of the second ground plane was found to be a critical factor in determining the phase of the "isolated" port. When this second ground plane is brought close enough to the spiral, the phase shifts from −90 to 90 degrees.

In alternative embodiments, the filars 52, 53 of the bifilar spiral 43 of splitter 51 are placed closer to each other or even overlapping each other to increase coupling, to the extreme case of even power division for a 3 db splitter.

The spirals previously described are Archimedean spirals, however, equiangular spirals or spirals built with other smooth math functions can also be used. Further, the spirals are flat, however, the spirals can also be conical or cylindrical shaped resulting in a three-dimensional power divider. The splitter 51 is also easier to design and build than a prior art broadband 90 degree splitter since there are no multiple sections.

In light of the above, it is therefore understood that within the scope of the appended claims, the invention may be practiced otherwise than as specifically described.

What is claimed is:

1. A broadband spiral transmission line power divider having two filars with tapered ends, each of said two filars shaped as an Archimedean spiral having first ends and distal ends, comprising:
    a board having a topside for operatively mounting the two filar spirals, said topside having a layer of dielectric material disposed thereon, and a bottom side, wherein said two filar spirals are mounted to said topside of said board on top of the layer of dielectric material;
    a first ground plane mounted to the bottom side of the board;
    a second ground plane mounted above both the topside of the board and the two filar spirals;
    a plurality of center coaxial connectors electrically mounted through the first ground plane on the bottom side of the board and joined to the respective first ends of the corresponding two filar spirals;
    gaps in the two filar spirals at the respective distal ends thereof which are present proximate to the respective tapered ends thereby truncating the two filar spirals;
    a plurality of outer coaxial connectors electrically mounted through the first ground plane on the bottom side of the board and to joined to the two filar spirals at a position directly adjacent to the gaps in the two filar spirals; and
    metal sides operatively mounted between the first ground plane and the second ground plane along perimeters thereof thereby encasing the board.

2. The broadband spiral transmission line power divider according to claim 1, wherein the plurality of center coaxial connectors and the plurality of outer coaxial connectors are soldered to the first ground plane and soldered to the two filar spirals.

3. The broadband spiral transmission line power divider according to claim 2, wherein the two filar spirals are copper plated, said two filar spirals each have a width of 3/32 of an inch and are spaced approximately 3/32 of an inch between each other.

4. The broadband spiral transmission line power divider according to claim 3, further comprising a second dielectric layer operatively mounted between the two filar spirals and the second ground plane.

5. The broadband spiral transmission line power divider according to claim 4, further comprising means for adjusting a predetermined distance between the second ground plane and the two filar spirals to obtain a low voltage standing wave ratio.

6. The broadband spiral transmission line power divider according to claim 4, wherein a predetermined distance between the second ground plane and the two filar spirals is adjustable for obtaining a low voltage standing wave ratio.

7. The broadband spiral transmission line power divider according to claim 6, wherein the second ground plane is mounted at the predetermined distance from the two filar spirals to cause a phase shift from −90 to 90 degrees.

8. The broadband spiral transmission line power divider according to claim 1, wherein a vertical distance between the second ground plane and the two filar spirals is larger than a vertical distance between the first ground plane and the two filar spirals, and a space between the second ground plane and the two filar spirals is occupied by air.

9. The broadband spiral transmission line power divider according to claim 1, further comprising:
    a metal cylinder of a radius less than a radius of an inner end of one of said two filar spirals, said metal cylinder disposed on a vertical axis of the two filar spirals and joined to the first and second ground planes, wherein two of the plurality of center coaxial connectors are joined to the metal cylinder to connect to the first ends of the two filar spirals; and
    wherein a vertical distance between the second ground plane and the two filar spirals is equal to a vertical distance between the first ground plane and the two filar spirals, and a space between the first ground plane and the two filar spirals is occupied with dielectric material, and a space between the second ground plane and the two filar spirals is occupied by dielectric material.

10. A broadband spiral transmission line power divider having two filars with tapered ends, said two filars including a first filar and a second filar each shaped as an Archimedean spiral having first ends and distal ends, comprising:
    a first board having a topside for operatively mounting the first filar and a bottom side;
    the first filar mounted to the topside of said first board;
    a second board having a bottom side for operatively mounting the second filar, and a topside; wherein said second board is disposed parallel to said first board with the bottom side of said second board facing the topside of said first board;
    the second filar mounted to the bottom side of said second board;
    a plurality of metal side supports to support and secure the second board to the first board, the plurality of metal side supports operatively mounted between the first board and the second board along a perimeter of both the first and the second board;
    a first ground plane mounted to the bottom side of the first board;
    a second ground plane mounted to the topside of the second board;
    a first plurality of center coaxial connectors electrically mounted through the first ground plane on the bottom side of the first board and joined to the first end of the first filar;
    a second plurality of center coaxial connectors electrically mounted through the second ground plane on the topside of the second board and joined to the first end of the second filar;
    gaps in each of the two filars at the distal ends of the two filars proximate to the tapered ends thereby truncating the two filars;
    a first plurality of outer coaxial connectors electrically mounted through the first ground plane on the bottom side of the first board and joined to the distal end of the first filar at a position directly adjacent to the gap in the first filar; and
    a second plurality of outer coaxial connectors electrically mounted through the second ground plane on the topside of the second board and joined to the distal end of the second filar at a position directly adjacent to the gap in the second filar.

11. The broadband spiral transmission line power divider according to claim 10, wherein the first plurality of center coaxial connectors are soldered to the first ground plane on the bottom side of the first board and soldered to the first end of the first filar mounted on the first board; and the second plurality of center coaxial connectors are soldered to the second ground plane on the topside of the second board and soldered to the first end of the second filar mounted on the second board.

12. The broadband spiral transmission line power divider according to claim 10, wherein the first plurality of outer coaxial connectors are soldered to the first ground plane on the bottom side of the first board and soldered to the distal end of the first filar mounted on the first board; and the second plurality of outer coaxial connectors are soldered to the second ground plane on the topside of the second board and soldered to the distal end of the second filar mounted on the second board.

13. The broadband spiral transmission line power divider according to claim 10, further comprising:

a dielectric layer disposed between the topside of the first board and the bottom side of the second board.

14. The broadband spiral transmission line power divider according to claim 13, wherein the first plurality of center coaxial connectors are soldered to the first ground plane on the bottom side of the first board and soldered to the first end of the first filar mounted on the first board; and the second plurality of center coaxial connectors are soldered to the second ground plane on the topside of the second board and soldered to the first end of the second filar mounted on the second board.

15. The broadband spiral transmission line power divider according to claim 13, wherein the first plurality of outer coaxial connectors are soldered to the first ground plane on the bottom side of the first board and soldered to the distal end of the first filar mounted on the first board; at and the second plurality of outer coaxial connectors are soldered to the second ground plane on the topside of the second board and soldered to the distal end of the second filar mounted on the second board.

\* \* \* \* \*